(12) United States Patent
Yagoda et al.

(10) Patent No.: US 10,833,043 B2
(45) Date of Patent: Nov. 10, 2020

(54) LASER ABLATION FOR WIRE BONDING ON ORGANIC SOLDERABILITY PRESERVATIVE SURFACE

(71) Applicant: Continental Automotive Systems, Inc., Auburn Hills, MI (US)

(72) Inventors: Jared Yagoda, Wauconda, IL (US); Allyson Beuhler, Woodbridge, IL (US)

(73) Assignee: Vitesco Technologies USA, LLC, Auburn Hills, MI (US)

( * ) Notice: Subject to any disclaimer, the term of this patent is extended or adjusted under 35 U.S.C. 154(b) by 0 days.

(21) Appl. No.: 16/222,356

(22) Filed: Dec. 17, 2018

(65) Prior Publication Data
US 2019/0198475 A1 Jun. 27, 2019

Related U.S. Application Data

(60) Provisional application No. 62/608,676, filed on Dec. 21, 2017.

(51) Int. Cl.
*H01L 23/00* (2006.01)
*H05K 1/09* (2006.01)
(Continued)

(52) U.S. Cl.
CPC .............. *H01L 24/48* (2013.01); *H01L 24/85* (2013.01); *H05K 1/09* (2013.01); *H05K 1/181* (2013.01); *H05K 3/282* (2013.01); *H05K 3/32* (2013.01); *H05K 3/341* (2013.01); *H01L 24/45* (2013.01); *H01L 2224/45124* (2013.01); *H01L 2224/45139* (2013.01); *H01L 2224/45144* (2013.01); *H01L 2224/45147* (2013.01); *H01L 2224/45164* (2013.01); *H01L 2224/45565* (2013.01);
(Continued)

(58) Field of Classification Search
CPC ......... H01L 24/45; H01L 24/48; H01L 24/85; H01L 2224/45565; H01L 2224/48227; H01L 2224/85214; H05K 1/181; H05K 3/32; H05K 3/282; H05K 3/341; H05K 3/0082; H05K 2203/10; H05K 2203/107; H05K 2201/10287
See application file for complete search history.

(56) References Cited

U.S. PATENT DOCUMENTS 6,933,614 B2 * 8/2005 Lee .................... H01L 24/03
257/750
9,536,818 B2 * 1/2017 Lin .................. H01L 23/49894
(Continued)

FOREIGN PATENT DOCUMENTS

CN 107333394 A * 11/2017
EP 1008675 A1 6/2000
(Continued)

OTHER PUBLICATIONS

Intellectual Property Office Search Report dated Jun. 4, 2018 for corresponding Great Britain application No. GB1801442.3.
(Continued)

*Primary Examiner* — Nathan Milakovich

(57) ABSTRACT

A printed circuit board is disclosed. The printed circuit board includes: a substrate layer; a copper layer disposed on the substrate layer; and an organic solderability preservative (OSP) layer disposed on the copper layer. The OSP layer defines one or more laser treated OSP surfaces.

7 Claims, 2 Drawing Sheets

(51) Int. Cl.
*H05K 1/18* (2006.01)
*H05K 3/00* (2006.01)
*H05K 3/28* (2006.01)
*H05K 3/32* (2006.01)
*H05K 3/34* (2006.01)

(52) U.S. Cl.
CPC ............... *H01L 2224/45624* (2013.01); *H01L 2224/48227* (2013.01); *H01L 2224/48647* (2013.01); *H01L 2224/48747* (2013.01); *H01L 2224/48847* (2013.01); *H01L 2224/85214* (2013.01); *H05K 3/0082* (2013.01); *H05K 2201/10287* (2013.01); *H05K 2203/10* (2013.01); *H05K 2203/107* (2013.01)

(56) References Cited

U.S. PATENT DOCUMENTS

| 10,269,743 | B2* | 4/2019 | Chang | ................. H01L 25/50 |
| 2008/0268267 | A1 | 10/2008 | Barbetta et al. | |
| 2009/0008796 | A1 | 1/2009 | Qimonda | |
| 2011/0300307 | A1* | 12/2011 | Nakai | ................. B23K 26/40 427/555 |
| 2013/0089703 | A1* | 4/2013 | Hong | ................. H05K 3/287 428/138 |
| 2017/0019991 | A1* | 1/2017 | Miyamoto | ........... H05K 3/4007 |

FOREIGN PATENT DOCUMENTS

| EP | 2288240 | A2 | 2/2011 |
| EP | 2746427 | A1 | 6/2014 |
| JP | 2006286852 | A | 10/2006 |
| JP | 2014192205 | A | 10/2014 |
| TW | 201208509 | A | 2/2012 |

OTHER PUBLICATIONS

International Search Report and the Written Opinion of the International Searching Authority dated Apr. 3, 2019 for corresponding PCT application No. PCT/US2018/066412.

* cited by examiner

LASER ABLATION FOR WIRE BONDING ON ORGANIC SOLDERABILITY PRESERVATIVE SURFACE

TECHNICAL FIELD

This disclosure relates to laser ablation for wire bonding on an organic solderability preservative (OSP) surface.

BACKGROUND

A printed circuit board (PCB) mechanically supports and electrically connects electronic components or electrical components using conductive tracks, pads, and other features etched from one or more sheet layers of copper laminated onto and/or between sheet layers of non-conductive substrate. A PCB generally includes a flat sheet of insulating substrate that provides the PCB with its mechanical strength and integrity, and a layer of copper cladding laminated to the substrate. The copper is chemically etched to cut out areas so that the layer of copper is divided into separate conducting regions, forming a circuit wiring pattern. The layer of copper can oxidize and deteriorate if left unprotected, resulting in an unusable PCB. Therefore, PCBs undergo a surface finish that forms an interface between the components of the PCB and the PCB. The surface finish protects the exposed copper circuitry and provides a solderable surface when assembling the components to the PCB. Several surface finishes are available. Electroless nickel immersion gold (ENIG) is a type of surface finish used for PCBs and includes an electroless nickel plating covered with a thin layer of immersion gold that protects the nickel from oxidization. Although ENIG is a common surface finish used in the industry, ENIG can be expensive and may result in a buildup of phosphorus between the nickel and the gold layers that may result in a fractured surface and faulty connection. In some instances, a layer of electroless palladium is plated onto the nickel to create ENEPIG surface finish. ENEPIG offers the best characteristics for PCBs, however it is more costly than ENIG.

There are several methods that may be used to make the interconnections between an integrated circuit or other semiconductor device and its packaging during semiconductor device fabrication. Wire bonding is such a method. Wire bonding is generally used because it is considered to be the most cost-effective and flexible interconnect technology. During the wire bonding process, a length of small diameter soft metal wire is attached to a compatible metallic surface without the use of solder, flux, and in some cases, with the use of heat, e.g., above 150 degrees Celsius. Soft metals include, but are not limited to, Gold (Au), Copper (Cu), Silver (Ag), Aluminium (Al), and alloys such as palladium-Silver (PdAg) and others. The most robust wire bonding process is when the PCB has an ENIG surface or an ENEPIG surface. However, as previously mentioned ENIG and ENEPIG surfaces are expensive.

Accordingly, there exists a need for a process or method that provides a PCB with a surface finish that is sufficient for wire bonding, minimizes or eliminates failures, and is cost effective.

SUMMARY

One aspect of the disclosure provides a printed circuit board. The printed circuit board includes: a substrate layer; a copper layer disposed on the substrate layer; and an organic solderability preservative (OSP) layer disposed on the copper layer. The OSP layer defines one or more laser treated OSP surfaces.

Implementations of the disclosure may include one or more of the following optional features. In some implementations, the OSP layer has a thickness between about 100 and 500 nanometer. The printed circuit board may include a component wire bonded to the one or more laser treated OSP surfaces. One or more bondwires may connect the component to the one or more laser treated OSP surfaces. In some examples, the one or more bondwires include an aluminium bondwire, a copper bondwire, a silver bondwire, a gold bondwire, or an aluminium coated copper wire.

Another aspect of the disclosure provides a method. The method includes: providing a substrate layer; providing a copper layer disposed on the substrate layer; and providing an organic solderability preservative (OSP) layer disposed on the copper layer. The method also includes: exposing a surface of the copper layer by applying a laser beam from a laser on the OSP layer; and providing a connection between a component and the exposed surface of the copper layer.

Implementations of this aspect of the disclosure may include one or more of the following optional features. In some implementations, the OSP layer has a thickness between about 100 and 500 nanometer. The connection may include a bondwire wire bonded to the exposed surface of the copper layer. In some examples, the bondwire is one of an aluminium bondwire, a copper bondwire, a silver bondwire, a gold bondwire, and aluminium coated copper wire.

DESCRIPTION OF DRAWINGS

Like reference symbols in the various drawings indicate like elements.

DETAILED DESCRIPTION

Figure 1:
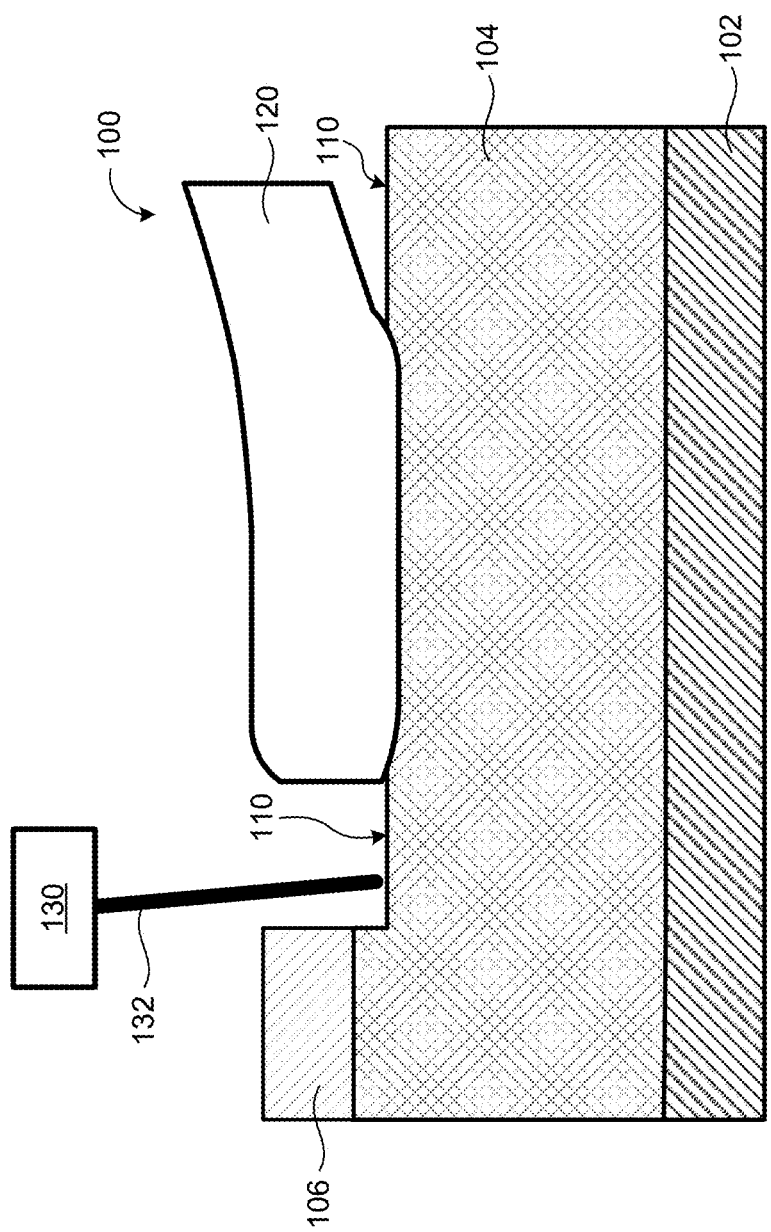
FIG. 1 is a schematic view of an exemplary laser ablated PCB having an OSP layer.

Referring to FIG. 1, a laser treated OSP (organic solderability preservative) surface PCB 100 provides a cost effective alternative to a PCB having an ENIG surface finish or an ENIGPIG surface finish. An OSP surface protects the copper for solder or press-fit connections. This OSP surface permits solder connection between the copper and a component, as well as a press-fit connection between a substrate and a press-fit pin. As shown, the PCB 100 includes a substrate 102, a copper layer 104 disposed on the substrate 102, and an OSP surface finish 106 disposed on the copper layer 104. The substrate 102 is a flat sheet of insulating substrate material. The OSP layer 106 is a surface finish that uses a water-based organic compound that selectively bonds to the copper layer 104 and protects the copper until soldering. In other words, the OSP layer 106 is an organic finish generated on clean and bare copper by absorption. The applied water-based chemical compound belongs to azole family, such as, for example, benzotriazoles, imidazoles, and benzimidazoles, all of which get absorbed on the copper surface with coordination formed between them and the copper atoms, leading to the production of film. The OSP surface finish 106 is cost effective due to the simple chemical compound it utilizes, making it the most cost effective among all surface finished; thus, lowering the overall cost of PCBs. Other advantages of using OSP surface finish 106 include its simple process and reworkability when a PCB is found damaged, being environmentally friendly since it a water-based compound is applied during the process. The OSP layer 106 may have a thickness between 100 and 500 nanometers.

In some implementations, a laser 130 applies a laser beam 132 on sections of the OSP layer 106 resulting in a wire-bondable surface 110. The laser 130 may be a pulse diode laser. The laser 130 may include other types of laser, such as, but not limited to, CO2 laser, fiber laser, neodymium yttrium-aluminium-garnet (YAG) laser, or continuous wave laser. As shown, a bondwire 120 has an end that is wedge bonded, stich and ball boned, laser bonded, or other types of bonding not listed, to the clean surface finish 110 and another end (not shown) connected to an integrated circuit, any other semiconductor, or to a leadframe. In some examples, wire bonds are formed using two types of tools, a wedge that forms a wedge bond, or a capillary that formed a ball bond. Other types of wire bonds, such as, but not limited to, laser bonding and other ultrasonic bonding may also be used. The bondwire 120 may be aluminium, copper, silver, or gold, or may be any combination of metal coating on a metal core, such as aluminium coated copper. The bondwire 120 has a diameter that may be 15 micrometer and up to several hundred micrometers for high-power applications. In some examples, the bondwire 120 has a diameter of 8 millimeters.

Figure 2:
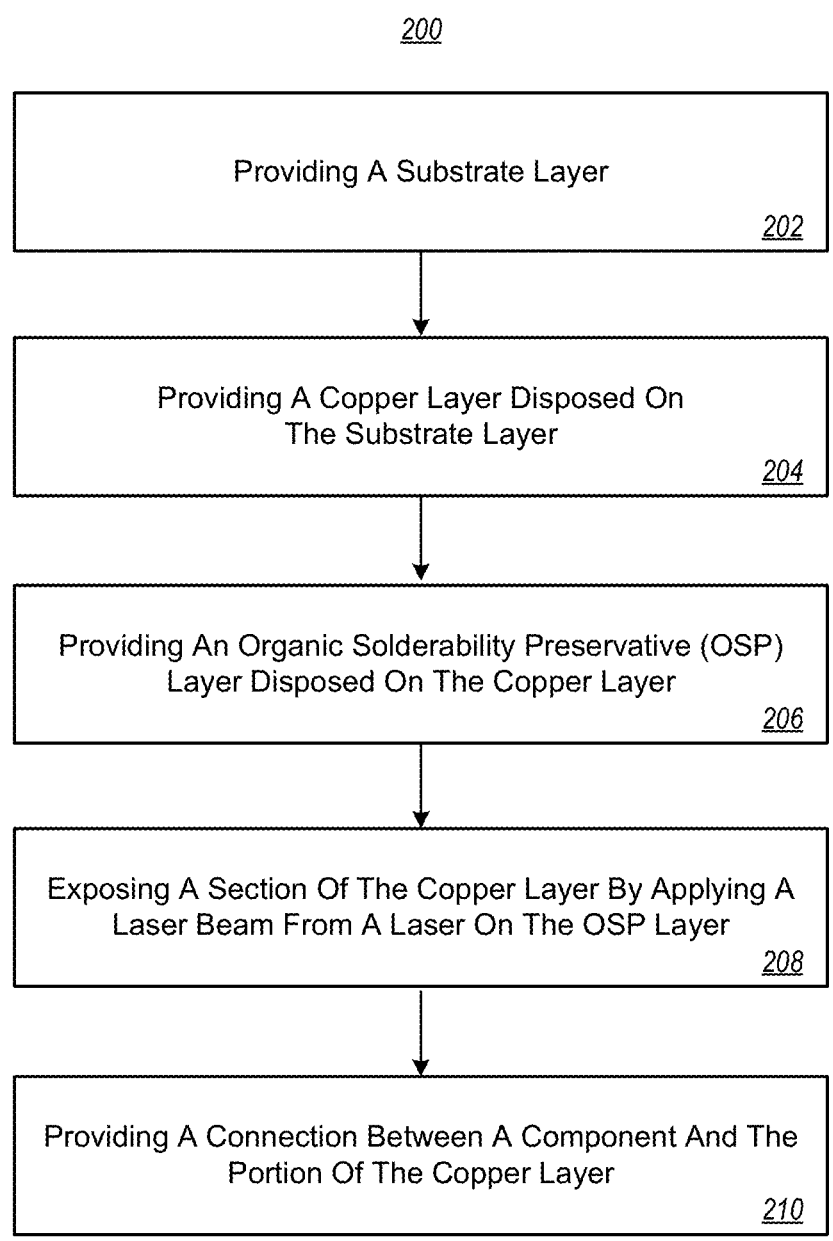
FIG. 2 is a schematic view of an exemplary arrangement of operations for laser ablation of an OSD layer of a PCB of FIG. 1.

FIG. 2 is a schematic view of an exemplary arrangement of operations for a method 200 of laser ablation of an OSD layer of a PCB 100 of FIG. 1. At block 202, the method 200 includes providing a substrate layer 102. At block 204, the method 200 includes providing a copper layer 104 disposed on the substrate layer 102. At block 206, the method 200 providing an OSP layer 106 disposed on the copper layer 104. At block 208, the method 200 includes exposing a surface 110 of the copper layer 104 by applying a laser beam 132 from a laser 130 on the OSP layer 106. The exposed surface 110 may or may not include residual OSP leftover after laser operation. The exposed surface 110 may or may not include slight to moderate removal of copper after the laser operation. At block 210, the method 200 includes providing a connection between a component (not shown) and the exposed surface 110 of the copper layer 104.

In some implementations, the OSP layer 106 has a thickness between about 100 and 500 nanometer. The connection may include a bondwire 120 bonded to the exposed surface 110 of the copper layer 104. The bondwire 120 may be an aluminium bondwire, a copper bondwire, a silver bondwire, or a gold bondwire.

A number of implementations have been described. Nevertheless, it will be understood that various modifications may be made without departing from the spirit and scope of the disclosure. Accordingly, other implementations are within the scope of the following claims. For example, the actions recited in the claims can be performed in a different order and still achieve desirable results.

What is claimed is:

1. A method comprising:
providing a substrate layer;
providing a copper layer disposed on the substrate layer;
providing an organic solderability preservative (OSP) layer disposed on the copper layer;
exposing a surface of the copper layer by applying a laser beam from a laser on the OSP layer, the applied laser beam removing an amount of the copper layer such that a thickness of the copper layer under the exposed surface is less than a thickness of the copper layer that is under the OSP layer; and
providing a connection between a component and the exposed surface of the copper layer.

2. The method of claim 1, wherein the OSP layer has a thickness between about 100 and 500 nanometer.

3. The method of claim 1, wherein the connection comprises a bondwire wire bonded to the exposed surface of the copper layer.

4. The method of claim 3, wherein the bondwire is one of an aluminium bondwire, a copper bondwire, a silver bondwire, a gold bondwire, and aluminium coated copper wire.

5. The method of claim 1, wherein the laser beam comprises one of a fiber laser and a continuous wave laser.

6. The method of claim 1, wherein the laser beam comprises a fiber laser.

7. The method of claim 1, wherein the laser beam comprises a continuous wave laser.

* * * * *